United States Patent
Kim et al.

(10) Patent No.: US 7,561,490 B2
(45) Date of Patent: Jul. 14, 2009

(54) SEMICONDUCTOR MEMORY DEVICE AND METHOD FOR DRIVING THE SAME

(75) Inventors: Jee-Yul Kim, Kyoungki-do (KR); Beom-Ju Shin, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 193 days.

(21) Appl. No.: 11/819,809

(22) Filed: Jun. 29, 2007

(65) Prior Publication Data

US 2008/0164919 A1  Jul. 10, 2008

(30) Foreign Application Priority Data

Jan. 8, 2007   (KR)   ...................... 10-2007-0002066

(51) Int. Cl.
    *G11C 8/18*   (2006.01)
(52) U.S. Cl. .................................. 365/233.11; 365/194
(58) Field of Classification Search ............ 365/233.11, 365/194
    See application file for complete search history.

(56) References Cited

U.S. PATENT DOCUMENTS

| | | | | |
|---|---|---|---|---|
| 6,151,271 A * | 11/2000 | Lee | ........................ | 365/230.03 |
| 6,446,180 B2 | 9/2002 | Li et al. | | |
| 6,667,913 B2 * | 12/2003 | Okuda et al. | ............ | 365/189.15 |
| 6,717,887 B1 * | 4/2004 | Kono et al. | ............. | 365/189.14 |
| 6,813,197 B2 | 11/2004 | Park | | |
| 6,836,165 B2 * | 12/2004 | Goto et al. | .................. | 327/158 |
| 6,977,848 B2 | 12/2005 | Choi | | |
| 6,982,924 B2 | 1/2006 | Na | | |
| 6,987,705 B2 | 1/2006 | Kim et al. | | |
| 6,989,700 B2 | 1/2006 | Kim | | |
| 7,027,336 B2 | 4/2006 | Lee | | |
| 7,081,784 B2 | 7/2006 | Kang | | |
| 7,103,133 B2 | 9/2006 | Jung | | |
| 7,154,311 B2 | 12/2006 | Lim | | |
| 7,170,313 B2 | 1/2007 | Shin | | |
| 2003/0210577 A1 * | 11/2003 | Okuda et al. | ........... | 365/189.07 |
| 2006/0267649 A1 | 11/2006 | Park et al. | | |

FOREIGN PATENT DOCUMENTS

| | | |
|---|---|---|
| JP | 2004-327008 | 11/2004 |
| JP | 2005-251370 | 9/2005 |
| KR | 10-2004-0013532 A | 2/2004 |

(Continued)

OTHER PUBLICATIONS

Korean Notice of Allowance issued in Korean Patent Application No. KR 10-2004-0002066, dated on May 14, 2008.

*Primary Examiner*—Tuan T. Nguyen
(74) *Attorney, Agent, or Firm*—Mannava & Kang, P.C.

(57) ABSTRACT

A semiconductor memory device includes: a delay locked loop (DLL) for delaying an external clock to generate a DLL clock; an output control unit for generating a select signal based on a column address strobe (CAS) latency signal and a delay time corresponding to a total delay time of the DLL being in a delay locked state; and an output enable signal generating unit for generating a plurality of output enable signals in response to the DLL clock and outputting a final output enable signal in response to the select signal.

24 Claims, 7 Drawing Sheets

FOREIGN PATENT DOCUMENTS

| | | |
|---|---|---|
| KR | 10-2005-0011945 A | 1/2005 |
| KR | 10-2005-0041613 A | 5/2005 |
| KR | 10-2005-0105557 A | 11/2005 |
| KR | 10-2005-0109813 A | 11/2005 |
| KR | 10-2006-0032428 A | 4/2006 |
| KR | 10-2006-0046024 A | 5/2006 |
| KR | 10-2006-0062426 A | 6/2006 |

* cited by examiner

FIG. 8
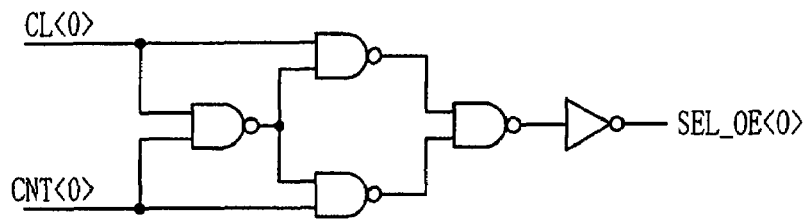
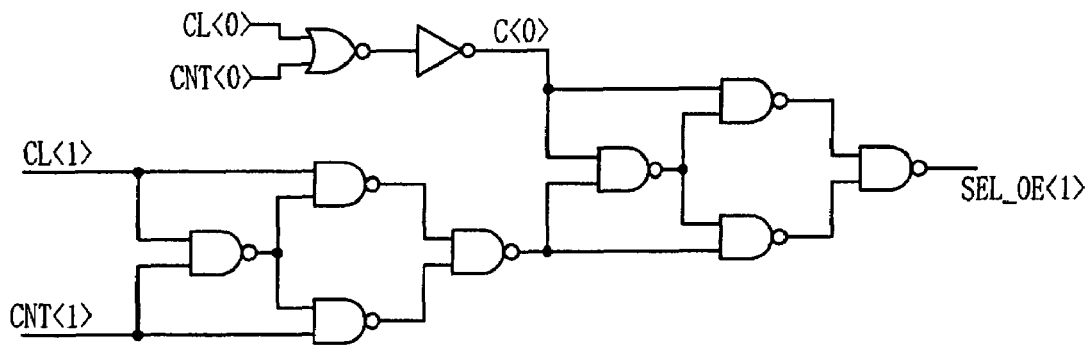
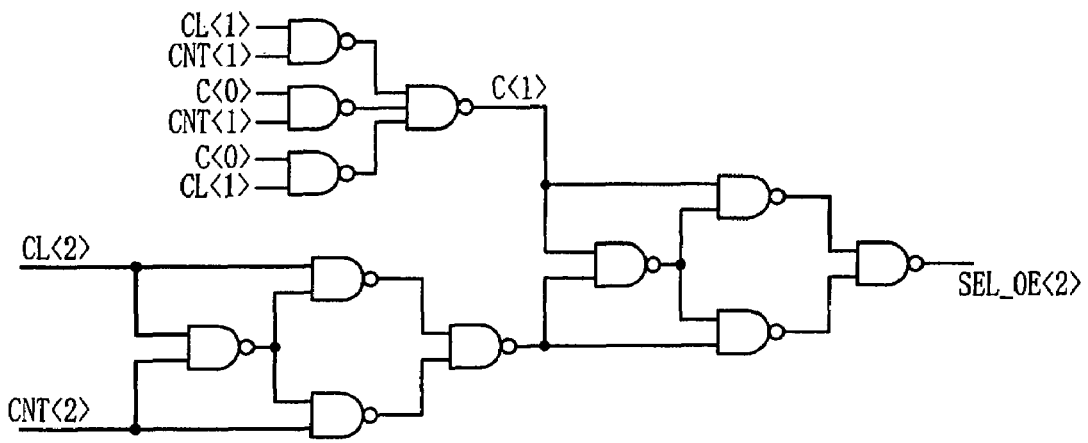

US 7,561,490 B2

SEMICONDUCTOR MEMORY DEVICE AND METHOD FOR DRIVING THE SAME

CROSS-REFERENCE TO RELATED APPLICATIONS

The present invention claims priority of Korean patent application number 10-2007-0002066, filed on Jan. 8, 2007, which is incorporated by reference in its entirety.

BACKGROUND OF THE INVENTION

The present invention relates to a semiconductor device, and more particularly, to a semiconductor memory device that selects one of a plurality of output enable signals in synchronization with an output signal of a delay locked loop (DLL).

Synchronous memory devices, e.g., double data rate (DDR) synchronous dynamic random access memory (SDRAM), are designed to generate a plurality of output enable signals in synchronization with a DLL clock (CLK_DLL) and having different pulse widths depending on a burst length, and to selectively use one of them according to a column address strobe (CAS) latency.

FIG. 1 is a block diagram of a conventional semiconductor memory device.

Referring to FIG. 1, a DLL 10 delays an external clock CLK_EXT to generate a DLL clock CLK_DLL. An output enable signal generator 12 generates a plurality of output enable signals OE0, OE1, OE1.5, ..., OEN in response to the DLL clock CLK_DLL and outputs one of the output enable signals OE0, OE1, OE1.5, ..., OEN as a final output enable signal according to a CAS latency CL. The final output enable signal masks a portion of the DLL clock CLK_DLL used for data output.

FIG. 2 is a block diagram of the DLL 10 shown in FIG. 1.

Referring to FIG. 2, the DLL 10 includes a buffer 20, a phase comparator 21, a delay controller 22, variable delay line 23, a duty corrector 24 and a delay model 25.

The buffer 20 buffers the external clock CLK_EXT to generate a source clock CLK_SRC. The phase comparator 21 compares a phase of the source clock CLK_SRC with a phase of a feedback clock CLK_FDB. The delay controller 22 generates a delay control signal CTR_DL in response to an output signal of the phase comparator 21. The variable delay line 23 delays the source clock CLK_SRC in response to the delay control signal CTR_DL. The duty corrector 24 corrects a duty of the delayed source clock CLK_SRC and outputs the corrected source clock as the DLL clock CLK_DLL. The delay model 25 outputs the feedback clock CLK_FDB by reflecting a delay of a real clock/data path.

Since the configuration and operation of the DLL 10 is well known, their detailed description will be omitted for conciseness.

FIG. 3 is a timing diagram of the DLL clock CLK_DLL and the plurality of output enable signals in the conventional semiconductor memory device of FIG. 1. It is assumed herein that it takes 15 ns to output internal data after a read command RD according to specification. Therefore, when "tCK" of the external clock CLK_EXT is 2.5 ns, the CAS latency is 6. In addition, it is assumed herein that a delay time T2 of the delay model 25 is 2 ns and a delay time T1 of the variable delay line 23 is 0.5 ns in a delay locked state. For convenience, delay time of the buffer 20 and the duty corrector 24 is not considered.

Referring to FIG. 3, the DLL 10 performs a DLL operation to generate the DLL clock CLK_DLL. Then, the read command RD is applied and the DLL clock CLK_DLL leads the external clock CLK_EXT. That is, the DLL clock CLK_DLL is generated after the external clock CLK_EXT is delayed by the delay time T1 of the variable delay line 23. The first DLL clock 0D corresponds to the first external clock 0E.

Since the CAS latency is 6, data must be outputted in synchronization with the sixth external clock 5E. Therefore, after the sixth DLL clock 5E is delayed by "T2", the data is outputted in synchronization with the DLL clock CLK_DLL. Consequently, the first data DT0 is outputted in synchronization with the sixth external clock 5E and the next data DT1, DT2 and DT3 are outputted in synchronization with the external clock CLK_EXT.

After the read command RD is applied, an internal read pulse signal IRDP is activated and an output enable signal "OE0" is generated in response to the internal read pulse signal IRDP. The output enable signal "OE0" has a pulse width corresponding to a burst length. Using the output enable signal "OE0", output enable signals "OE1" to "OEN" are generated in response to the DLL clock CLK_DLL. In other words, the output enable signals "OE1" to "OEN" are generated by shifting the output enable signal "OE0". More specifically, the output enable signals "OE1" to "OEN" are signals that are alternately generated at rising edges and falling edges. For convenience, only several output enable signals are shown in FIG. 3.

For example, when an output enable signal "OE4.5" is used for masking the sixth DLL clock 5D, the output enable signal generator 12 of FIG. 1 outputs the output enable signal "OE4.5" using the CAS latency signal CL having the CAS latency of 6.

However, in order to perform such an operation, the output enable signal to be used according to "tCK" and the CAS latency must be set. In other words, a total delay time of the DLL 10 in the delay locked state is defined as "the delay time (T1) of the variable delay line 23+the delay time (T2) of the delay model 25" and is 2.5 ns. Therefore, when a designer must predict the total delay time through a simulation and set "OE4.5" as the final output enable signal to be used when the CAS latency is 6. For example, when the total delay time is 5 ns, the designer must set "OE3" as the final output enable signal even though the CAS latency is 6.

As described above, since the total delay time of the DLL 10 in the delay locked state changes, the designer must previously predict the total delay time and set the output enable signal suitable for "tCK" and the CAS latency through a simulation verification.

SUMMARY OF THE INVENTION

Embodiments of the present invention are directed to providing a semiconductor memory device that can flexibly set a final output enable signal corresponding to a column address strobe (CAS) latency depending on device characteristics, without additional setting.

Embodiments of the present invention are directed to providing a semiconductor memory device that can flexibly set a final output enable signal corresponding to a CAS latency depending on characteristics of an external clock, without additional setting.

In accordance with an aspect of the present invention, there is provided a semiconductor memory device, including: a delay locked loop (DLL) for delaying an external clock to generate a DLL clock; an output control unit for generating a select signal based on a column address strobe (CAS) latency signal and a delay time corresponding to a total delay time of the DLL being in a delay locked state; and an output enable signal generating unit for generating a plurality of output enable signals in response to the DLL clock and outputting a final output enable signal in response to the select signal.

In accordance with another aspect of the present invention, there is provided a method for driving a semiconductor memory device having a delayed locked loop (DLL), including: delaying an external clock to generate a DLL clock; generating a select signal based on a column address strobe (CAS) latency signal and a delay time corresponding to a total delay time of the DLL being in a delay locked state; and generating a plurality of output enable signals in response to the DLL clock and outputting a final output enable signal in response to the select signal.

BRIEF DESCRIPTION OF THE DRAWINGS

FIG. 8 is a circuit diagram of a select signal generating unit shown in FIG. 4.

DESCRIPTION OF SPECIFIC EMBODIMENTS

Hereinafter, a semiconductor memory device for flexibly setting an output enable signal corresponding to a column address strobe (CAS) latency without additional setting in accordance with exemplary embodiments of the present invention will be described in detail with reference to the accompanying drawings.

Figure 4:
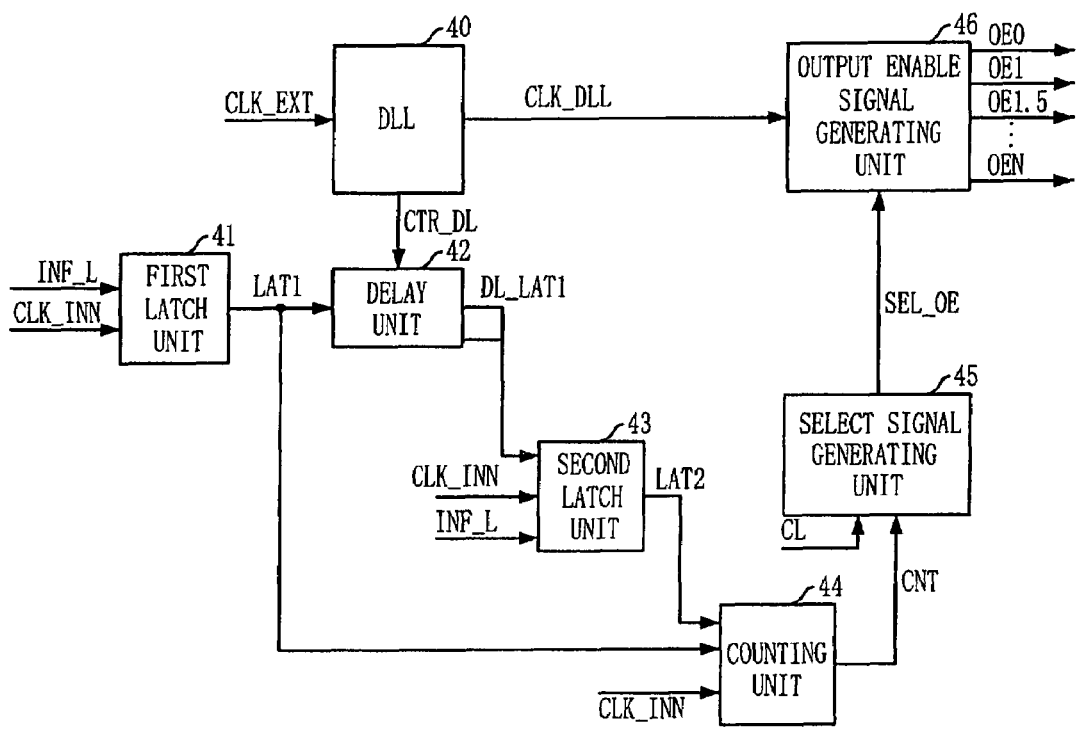
FIG. 4 is a block diagram of a semiconductor memory device in accordance with an embodiment of the present invention.

FIG. 4 is a block diagram of a semiconductor memory device in accordance with an embodiment of the present invention.

Referring to FIG. 4, the semiconductor memory device in accordance with the present invention includes a delayed locked loop (DLL) 40, first and second latch units 41 and 43, a delay unit 42, a counting unit 44, a select signal generating unit 45 and an output enable signal generating unit 46.

The delayed locked loop (DLL) 40 delays an external clock CLK_EXT to generate a DLL clock CLK_DLL. The first latch unit 41 latches a delay locking information signal INF_L in response to an internal clock CLK_INN. The delay unit 42 delays an output signal LAT1 of the first latch unit 41 in response to a delay control signal CTR_DL denoting a delay time corresponding to a total delay time of the DLL 40 being in a delay locked state. The second latch unit 43 latches a delay latching signal DL_LAT1 outputted from the delay unit 42 in response to the internal clock CLK_INN. The counting unit 44 counts a sampling clock during a period defined by the output signal LAT1 of the first latch unit 41 and an output signal LAT2 of the second latch unit 43. The select signal generating unit 45 generates a select signal SEL_OE for selecting one of a plurality of output enable signals OE0, OE1, OE1.5, ..., OEN as a final output enable signal in response to an output signal CNT of the counting unit 44 and a column address strobe (CAS) latency signal CL. The output enable signal generating unit 46 generates the plurality of output enable signals OE0, OE1, OE1.5, ..., OEN in response to the DLL clock CLK_DLL and outputs one of the output enable signals OE0, OE1, OE1.5, ..., OEN as the final output enable signal in response to the select signal SEL_OE.

The delay locking information signal INF_L is activated when the DLL 40 is in the delay locked state. When the DLL 40 is in the delay locked state, the total delay time of the DLL 40 is defined as a sum of i) the delay time of the buffer (20 in FIG. 2), ii) the locked delay time of the variable delay line (23 in FIG. 2), iii) the delay time of the duty corrector (24 in FIG. 2), and iv) the delay time of the delay model (25 in FIG. 2). The total delay time is determined by the delay unit 42, and information about the total delay time is calculated together with the CAS latency signal CL at the select signal generating unit 45 and is outputted as the select signal SEL_OE for selecting the final output enable signal OUT_OE.

Figure 5:
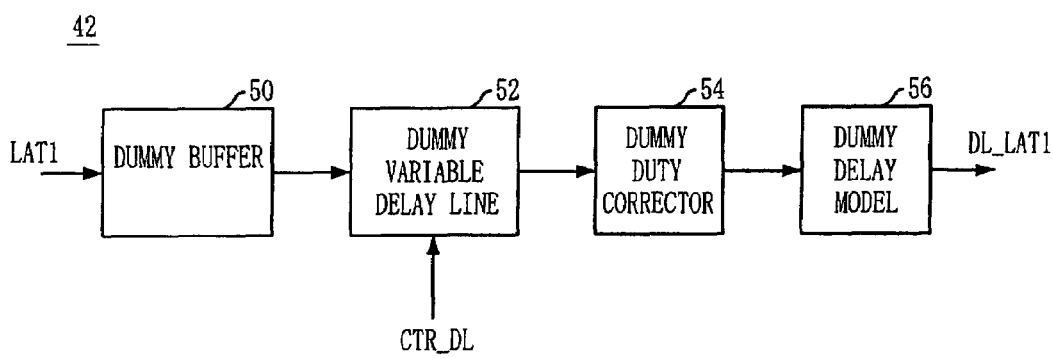
FIG. 5 is a block diagram of a delay unit shown in FIG. 4.

FIG. 5 is a block diagram of the delay unit 42 shown in FIG. 4.

Since the DLL 40 of FIG. 4 has the same configuration as that of FIG. 2, it will be described below with reference to FIGS. 2, 4 and 5.

The delay unit 42 includes a dummy buffer 50, a dummy variable delay line 52, a dummy duty corrector 54, and a dummy delay model 56.

Figure 1:
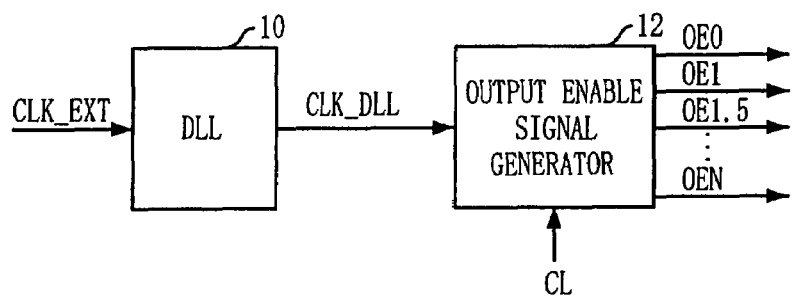
FIG. 1 is a block diagram of a conventional semiconductor memory device.
Figure 2:
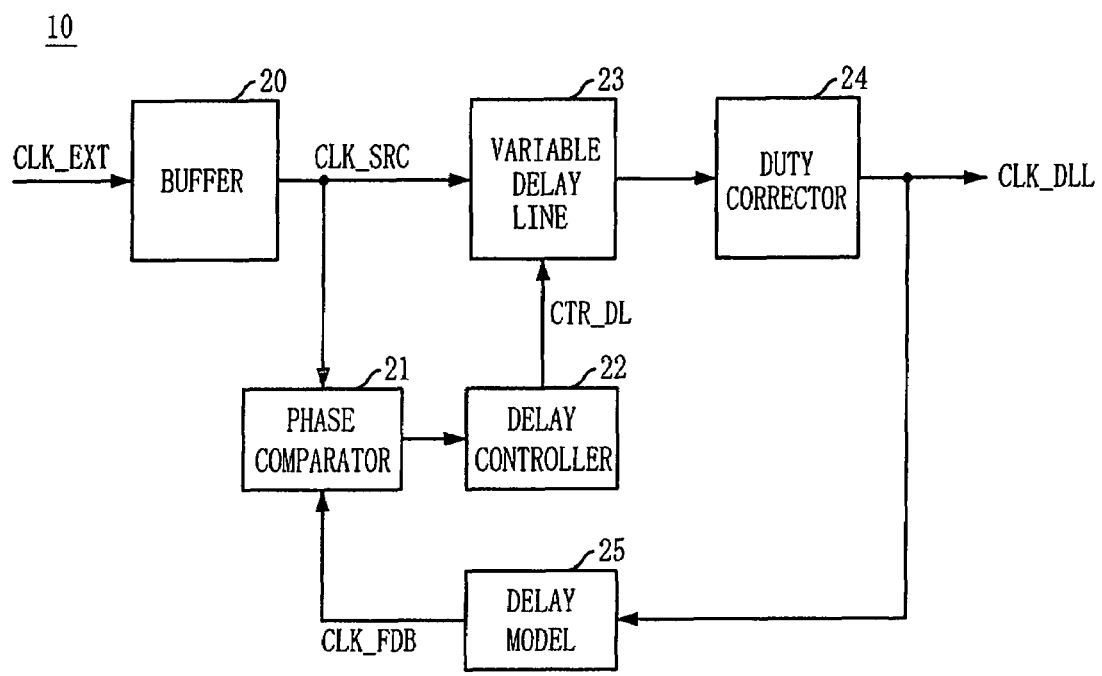
FIG. 2 is a block diagram of a delayed locked loop (DLL) shown in FIG. 1.
Figure 3:
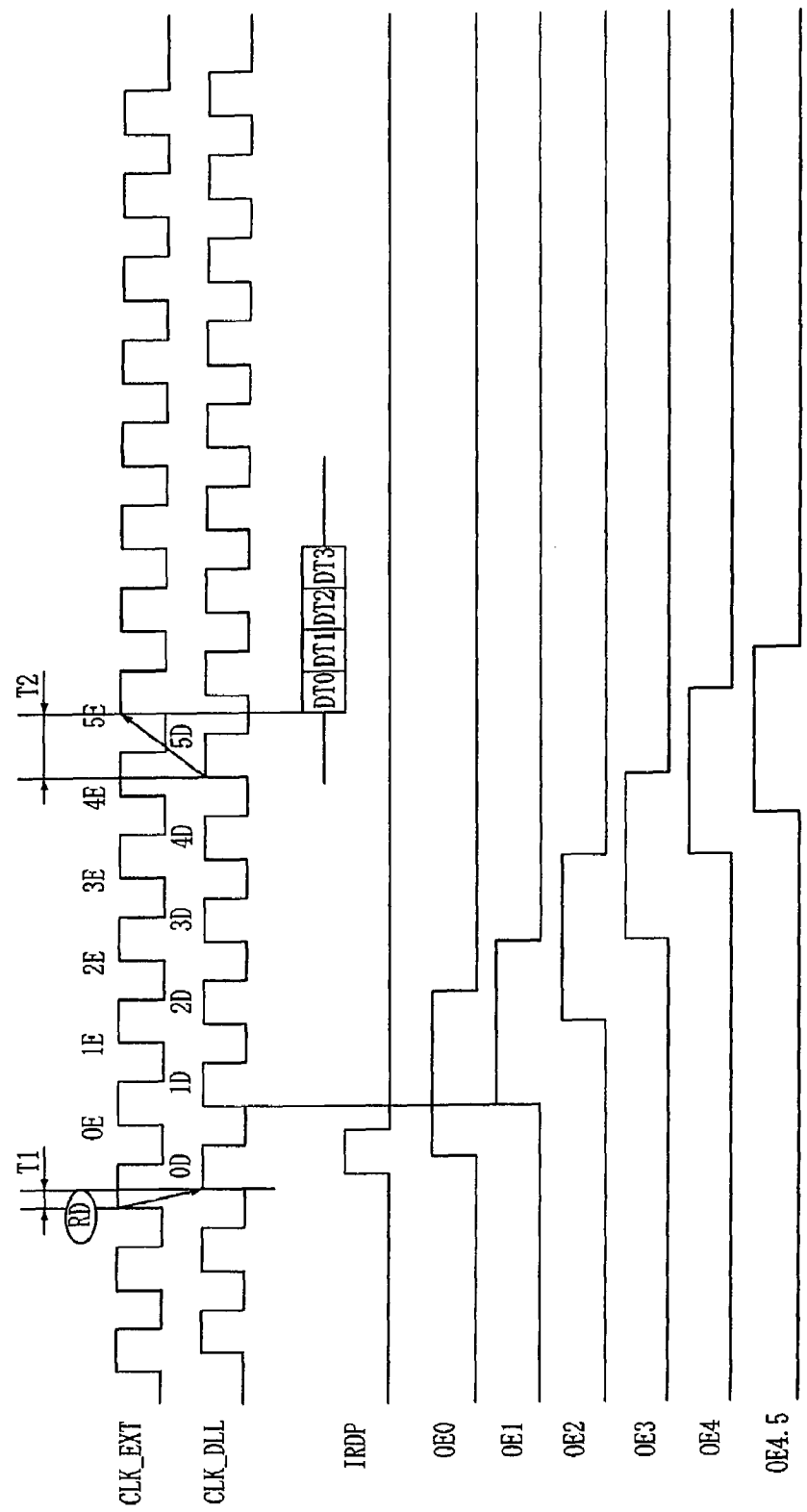
FIG. 3 is a timing diagram of a DLL clock and an output enable signal in the conventional semiconductor memory device of FIG. 1.

The dummy buffer 50 delays the output signal LAT1 of the first latch unit 41 as much as the external clock CLK_EXT is delayed by the buffer (20 in FIG. 2). The dummy variable delay line 52 delays an output signal of the dummy buffer 50 in response to the delay control signal CTR_DL, which is outputted from the delay controller 22, by a delay time during which the source clock CLK_SRC is delayed by the variable delay line 23. The dummy duty corrector 54 delays an output signal of the dummy variable delay line 52 by a delay time during which the output signal of the variable delay line 23 is delayed by the duty corrector 24. The dummy delay model 56 delays an output signal of the dummy duty corrector 54 by a delay time reflected by the delay model 25, and outputs the resulting signal as the delay latching signal DL_LAT1.

The output signal LAT1 of the first latch unit 41 is generated by latching the delay locking information signal INF_L and this latching operation is performed for ensuring a counting margin of the counting unit 44. In addition, the delay latching signal DL_LAT1 is latched by the second latch unit 43, and this latching operation is performed for ensuring a latching margin. That is, the delay unit 42 is provided for acquiring the information about the total delay time in the delay locked state by using the delay locking information signal INF_L and the delay latching signal DL_LAT1 outputted from the delay unit 42.

Meanwhile, the dummy buffer 50 may have the same structure as the buffer of the DLL 40, and the dummy variable delay line 52 may have the same structure as the variable delay line of the DLL 40. In addition, the dummy duty corrector may have the same structure as the duty corrector of the DLL 40, and the dummy delay model 56 may have the same structure as the delay model of the DLL 40.

Figure 6:
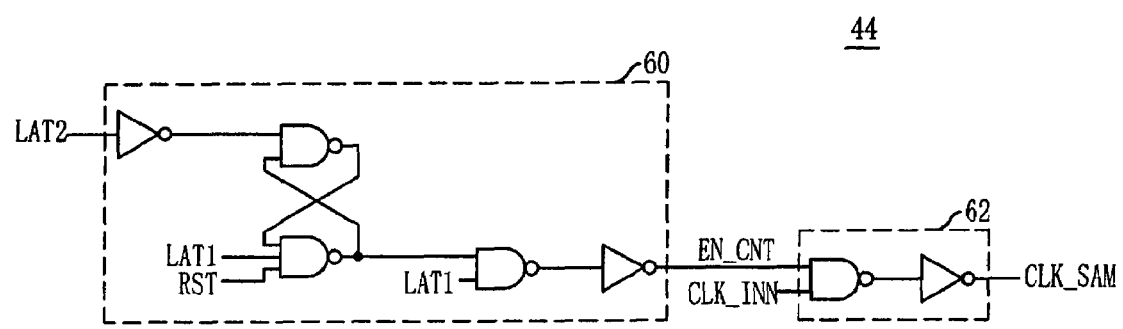
FIG. 6 is a circuit diagram of a counting unit shown in FIG. 4.

FIG. 6 is a circuit diagram of the counting unit 44 shown in FIG. 4.

Referring to FIG. 6, the counting unit 44 includes an enable signal generating unit 60, a clock output unit 62, and a clock counting unit (not shown).

The enable signal generating unit 60 generates an enable signal EN_CNT activated during a period defined by the latched delay locking information signal, i.e., the first latching signal LAT1, and the latched output signal of the delay unit 42, i.e., the second latching signal LAT2. The enable signal EN_CNT is a pulse signal that is set in response to the first latching signal LAT1 and reset in response to the second latching signal LAT2, and has a pulse width corresponding to the total delay time.

The clock output unit 62 samples the internal clock CLK_INN during the activation period of the enable signal EN_CNT. At this point, the internal clock CLK_INN may be a clock that can generate a sampling clock CLK_SAM during the activation period of the enable signal EN_CNT. The internal clock CLK_INN may be equal to the external clock CLK_EXT. The sampling clock CLK_SAM may be a clock signal that is toggled during the activation period of the enable signal EN_CNT.

The clock counting unit (not shown) counts the number of clocks of the sampling clock CLK_SAM and may be implemented using a bit counter. The use of the bit counter is determined by the maximum number of clocks of the sampling clock CLK_SAM. For example, the number of clocks of the sampling clock CLK_SAM is equal to or less than 8, a 3-bit counter is used to generate counting signals CNT<0:2>. The counting signals CNT<0:2> are code signals and are generated based on the number of clocks of the sampling clock CLK_SAM. For example, when the number of clocks is 3, the counting signals CNT<0:2> of "011" are generated. When the number of clocks is 4, the counting signals CNT<0:2> of "100" are generated.

Figure 7:
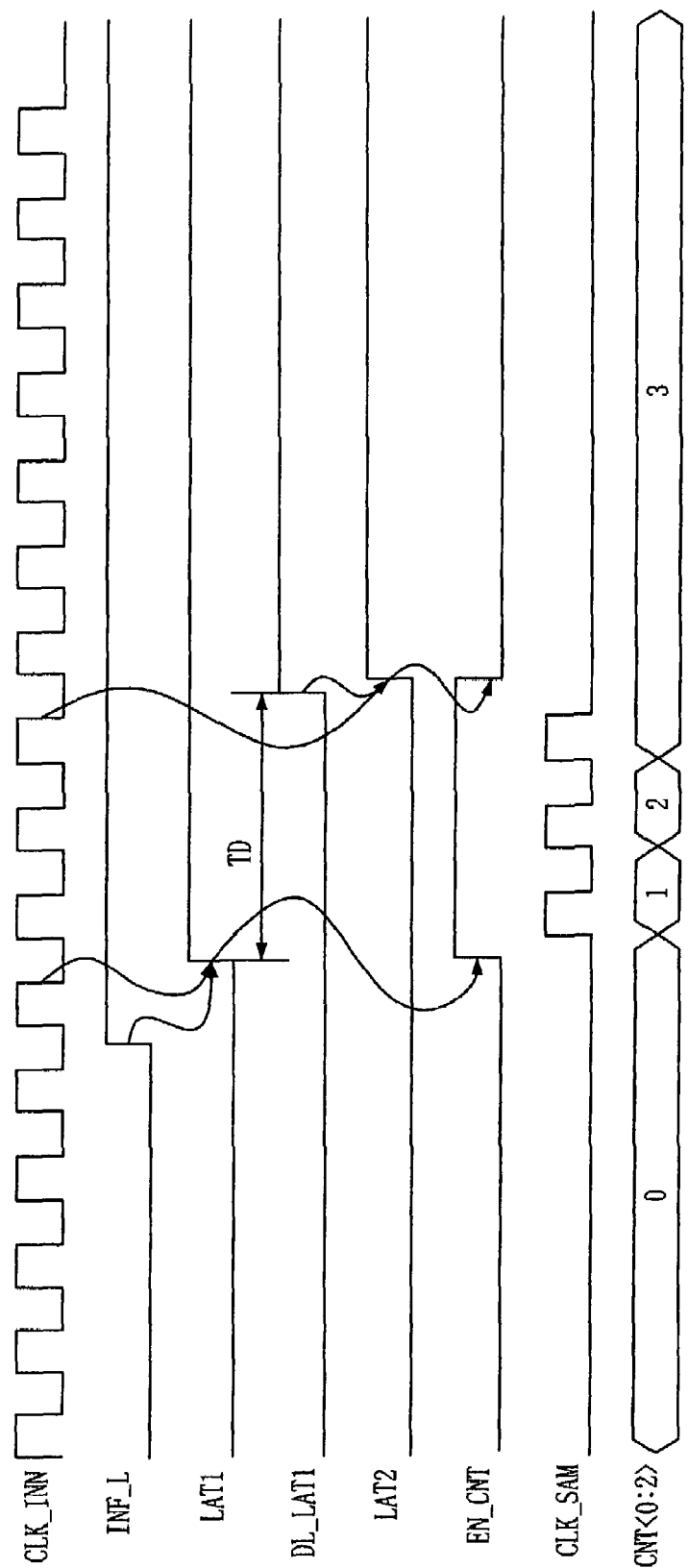
FIG. 7 is a timing diagram of signals used in the semiconductor memory device shown in FIGS. 4 to 6.

FIG. 7 is a timing diagram of the signals used in the semiconductor memory device shown in FIGS. 4 to 6.

Referring to FIG. 7, when the DLL 40 becomes the delay locked state so that the delay locking information signal INF_L is a logic HIGH, the first latch unit 41 outputs the delay locking information signal INF_L as the first latching signal LAT1 in response to the falling edge of the internal clock CLK_INN. The delay unit 42 outputs the delay latching signal DL_LAT1 by delaying the first latching signal LAT1 by the total delay time TD, and the second latch 43 outputs the delay latching signal DL_LAT1 as the second latching signal LAT2 in response to the falling edge of the internal clock CLK_INN.

The counting unit 44 generates the sampling clock CLK_SAM by sampling the internal clock CLK_INN during the total delay time TD by using the first and second latching signals LAT1 and LAT2, and counts the clock number of the sampling clock CLK_SAM to output the counting signals CNT<0:2>. In this case, four clocks are counted during the total delay time TD.

FIG. 8 is a circuit diagram of the select signal generating unit 45 shown in FIG. 4. It is assumed herein that the CAS latency is equal to or less than 8 and the number of clocks of the sampling clock CLK_SAM is also equal to or less than 8. The CAS latency signals CL<0:2> may be 3-bit code signals corresponding to the CAS latency, and the counting signals CNT<0:2> may be 3-bit code signals corresponding to the number of clocks of the sampling clock CLK_SAM. In addition, the select signals SEL_OE<0:2> may be 3-bit code signals provided by operation of the CAS latency signals CL<0:2> and the counting signals CNT<0:2>.

The select signal generating unit 45 may include a 3-bit adder. The 3-bit adder uses a half adder and a full adder and subtracts the counting signals CNT<0:2> from the CAS latency signals CL<0:2>. For example, when the CAS latency is 6 and the number of clocks of the sampling clock CLK_SAM is 3, the select signal generating unit 45 subtracts the counting signals CNT<0:2> of "011" from the CAS latency signals CL<0:2> of "011" to output the select signals SEL_OE<0:2> of "011". Then, the select signal generating unit 45 selects the final output enable signal in response to the select signals SEL_OE<0:2>. For example, when the CAS latency is 6 and the clock number of the sampling clock CLK_SAM is 1, the select signal generating unit 45 subtracts the counting signals CNT<0:2> of "001" from the CAS latency signals CL<0:2> of "011" to output the select signals SEL_OE<0:2> of "101". Then, the select signal generating unit 45 selects the final output enable signal in response to the select signals SEL_OE<0:2>.

Figure 9:
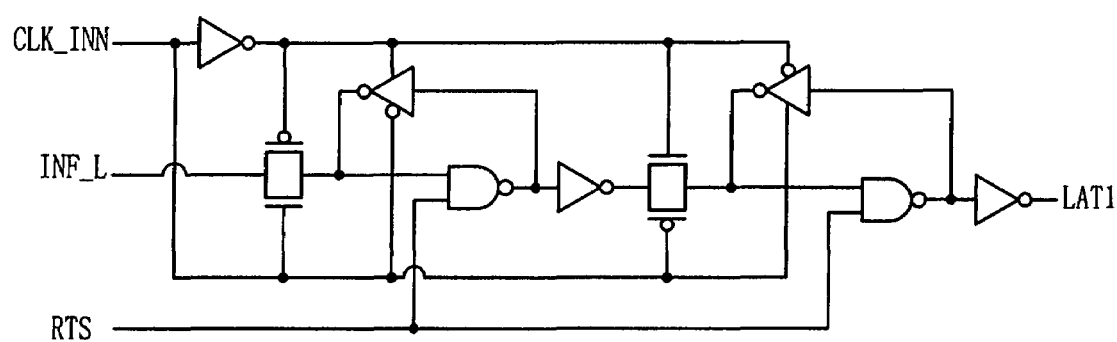
FIG. 9 is a circuit diagram of a first latch unit shown in FIG. 4.

FIG. 9 is a circuit diagram of the first latch unit 41 shown in FIG. 4.

Referring to FIG. 9, the first latch unit 41 is enabled in response to a reset signal RST and outputs the inputted delay locking information signal INF_L as the first latching signal LAT1 in response to the internal clock CLK_INN. Although a D flip-flop is used as the first latch unit 41 in FIG. 9, other types of flip-flops can also be used if only the delay locking information signal INF_L is outputted in response to the internal clock CLK_INN.

Figure 10:
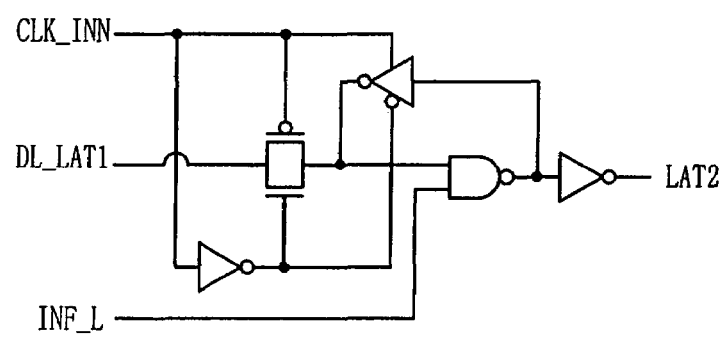
FIG. 10 is a circuit diagram of a second latch unit shown in FIG. 4.

FIG. 10 is a circuit diagram of the second latch unit 43 shown in FIG. 4.

Referring to FIG. 10, the second latch unit 43 is enabled in response to the delay locking information signal INF_L and outputs the delay latching signal DL_LAT1 as the second latching signal LAT2 in response to the internal clock CLK_INN. Although a general flip-flop is used as the second unit 43 in FIG. 10, other types of flip-flops can also be used if only the delay latching signal DL_LAT1 is outputted in response to the internal clock CLK_INN.

As described above, the output enable signal can be selected using the information provided by the operation of the CAS latency and the total delay time of the DLL 40. Therefore, the output enable signals can be flexibly selected according to the CAS latency and the internal delay elements of the semiconductor memory device.

According to the present invention, the final output enable signal can be generated or selected without setting the output enable signal corresponding to the CAS latency. Therefore, it can reduce time necessary to set the output enable signal corresponding to the CAS latency.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a delay locked loop (DLL) for delaying an external clock to generate a DLL clock;
   an output control unit for generating a select signal based on a column address strobe (CAS) latency signal and a delay time corresponding to a total delay time of the DLL being in a delay locked state; and
   an output enable signal generating unit for generating a plurality of output enable signals in response to the DLL clock and outputting a final output enable signal in response to the select signal.

2. The semiconductor memory device as recited in claim 1, wherein the select signal selects one of the plurality of output enable signals as the final output enable signal.

3. The semiconductor memory device as recited in claim 2, wherein the output control unit includes:

a delay unit for delaying a delay locking information signal by the delay time corresponding to the total delay time of the DLL being in a delay locked state;

a counting unit for generating a counting signal by counting a sampling clock during a period defined by the delay locking information signal and an output signal of the delay unit; and a select signal generating unit for generating the select signal in response to the counting signal and the CAS latency signal.

4. The semiconductor memory device as recited in claim 3, the output control unit further includes:

a first latch unit for latching the delay locking information signal in response to an internal clock; and a second latch unit for latching the output signal of the delay unit in response to the internal clock.

5. The semiconductor memory device as recited in claim 4, wherein the second latch unit is enabled in response to the delay locking information signal.

6. The semiconductor memory device as recited in claim 3, wherein the DLL includes:

a buffer for buffering the external clock to generate a source clock;

a phase comparator for comparing a phase of the source clock with a phase of a feedback clock;

a delay controller for generating a delay control signal in response to an output signal of the phase comparator;

a variable delay line for delaying the source clock in response to the delay control signal;

a duty corrector for correcting a clock duty of the output signal of the variable delay line to generate the DLL clock; and a delay model for outputting the feedback clock by reflecting a delay of a real clock/data path on the DLL clock.

7. The semiconductor memory device as recited in claim 6, wherein the delay unit includes:

a first delay unit for delaying the delay locking information signal by a delay time during which the external clock is delayed by the buffer;

a second delay unit for delaying an output signal of the first delay unit by a delay time reflected by the variable delay line in response to the delay control signal;

a third delay unit for delaying an output signal of the second delay unit by a delay time during which the output signal of the variable delay line is delayed by the duty corrector; and a fourth delay unit for delaying an output signal of the third delay unit by a delay time reflected by the delay model.

8. The semiconductor memory device as recited in claim 7, wherein the first delay unit includes a dummy buffer having the same structure as that of the buffer.

9. The semiconductor memory device as recited in claim 7, wherein the second delay unit includes a dummy variable delay line having the same structure as that of the variable delay line.

10. The semiconductor memory device as recited in claim 7, wherein the third delay unit includes a dummy duty corrector having the same structure as that of the duty corrector.

11. The semiconductor memory device as recited in claim 7, wherein the fourth delay unit includes a dummy delay model having the same structure as that of the delay model.

12. The semiconductor memory device as recited in claim 3, wherein the counting unit includes:

an enable signal generating unit for generating an enable signal activated during a period defined by the delay locking information signal and the output signal of the delay unit;

a clock output unit for sampling an internal clock in response to the enable signal to output sampling clock; and a clock counting unit for counting clock number of the sample clock.

13. The semiconductor memory device as recited in claim 12, wherein the enable signal is set in response to the delay locking information signal and is reset in response to the output signal of the delay unit.

14. The semiconductor memory device as recited in claim 12, wherein the sampling clock is toggled during the defined period.

15. The semiconductor memory device as recited in claim 12, wherein the clock counting unit is an N-bit counter, where N is a natural number.

16. The semiconductor memory device as recited in claim 15, wherein the value of N in the N-bit counter is determined by a maximum number of clocks of the sampling clock.

17. The semiconductor memory device as recited in claim 3, wherein the CAS latency signal and the output signal of the counting unit are code signals.

18. The semiconductor memory device as recited in claim 3, wherein the select signal generating unit operates the CAS latency signal and the output signal of the counting unit.

19. The semiconductor memory device as recited in claim 3, wherein the select signal is a select code signal comprised of code signals.

20. The semiconductor memory device as recited in claim 19, wherein the output enable signal generating unit includes an adder for receiving the CAS latency signal and the output signal of the counting unit to output the select code signal.

21. A method for driving a semiconductor memory device having a delayed locked loop (DLL), comprising:

delaying an external clock to generate a DLL clock;

generating a select signal based on a column address strobe (CAS) latency signal and a delay time corresponding to a total delay time of the DLL being in a delay locked state; and generating a plurality of output enable signals in response to the DLL clock and outputting a final output enable signal in response to the select signal.

22. The method as recited in claim 21, wherein the generating of the select signal includes:

delaying a delay locking information signal by the delay time corresponding to the total delay time of the DLL being in the delay locked state;

generating a counting signal by counting a sampling clock during a period defined by the delay locking information signal and the delayed delay locking information signal; and generating the select signal for selecting one of the plurality of output enable signals as the final output enable signal in response to the counting signal and the CAS latency signal.

23. The method as recited in claim 22, wherein the counting of the sampling clock includes:

generating an enable signal that is set in response to the delay locking information signal and is reset in response to the delayed delay locking information signal;

outputting an internal clock as the sampling signal in response to the enable signal; and counting the sampling clock to output the counting signal.

24. The method as recited in claim 23, wherein the counting signal and the CAS latency signal are code signals.

* * * * *